(12) United States Patent
Sakamoto et al.

(10) Patent No.: US 6,313,258 B1
(45) Date of Patent: Nov. 6, 2001

(54) AROMATIC POLYCARBODIIMIDE AND FILMS THEREOF

(75) Inventors: Michie Sakamoto; Amane Mochizuki; Michiharu Yamamoto, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/616,882

(22) Filed: Jul. 14, 2000

Related U.S. Application Data (63) Continuation-in-part of application No. 08/779,893, filed on Jan. 7, 1997, now Pat. No. 5,350,817.

(30) Foreign Application Priority Data

| Jan. 18, 1996 | (JP) | 8-26040 |
| Feb. 28, 1996 | (JP) | 8-69197 |
| Apr. 5, 1996 | (JP) | 8-110351 |

(51) Int. Cl.$^7$ .............. C08G 73/10; C08G 69/00
(52) U.S. Cl. .......... 528/170; 528/310; 528/322; 528/353; 428/473.5
(58) Field of Search .................. 528/170, 310, 528/322, 353; 428/473.5

(56) References Cited

U.S. PATENT DOCUMENTS

| 2,941,966 | 6/1960 | Campbell | 521/155 |
| 4,017,459 | 4/1977 | Onder | 528/170 |
| 5,338,794 | 8/1994 | Imashiro et al. | 528/44 |
| 6,008,311 | * 12/1999 | Sakamoto et al. | 525/907 |
| 6,051,677 | * 4/2000 | Maeda et al. | 528/310 |
| 6,107,448 | * 8/2000 | Sakamoto et al. | 528/310 |

OTHER PUBLICATIONS

G. Greber and H.R. Kricheldorf, A New Synthesis of Isocyanates and Isothiocyanates, Angew, Chem. Internat. Edit., vol. 7 (1968) No. 1 p. 941.

V.L.K. Valiii and H. Alper, A Simple, Convenient, and Efficient method for the Synthesis of Isocyanates from Urethanes, J. Org. Chem. 1995, 60, pp. 257–258.

* cited by examiner

Primary Examiner—P. Hampton-Hightower
(74) Attorney, Agent, or Firm—Sughrue, Mion, Zinn, Macpeak & Seas, PLLC (57) ABSTRACT

An aromatic polycarbodiimide having a specified structural unit is disclosed. The aromatic polycarbodiimide can give films, moldings, adhesives and the like each having excellent characteristics such as high heat resistance, high dimensional stability, high moisture resistance or the like, and therefore is suitable for use as a heat resistant covering material in, for example, production of electronic parts.

5 Claims, 3 Drawing Sheets

AROMATIC POLYCARBODIIMIDE AND FILMS THEREOF

CROSS REFERENCE TO THE RELATED APPLICATION

This application is a Continuation-In-Part application of application Ser. No. 08/779,893 filed Jan. 7, 1997, now U.S. Pat. No. 5,350,817.

FIELD OF THE INVENTION

The present invention relates to a novel aromatic polycarbodiimide and a film thereof. The aromatic polycarbodiimide of the present invention gives films, moldings, and adhesives each having various excellent characteristics such as high heat resistance, and high dimensional stability.

BACKGROUND OF THE INVENTION

Conventionally, polymerized products of an aromatic diisocyanate such as diphenylmethane diisocyanate (MDI), tolylene diisocyanate (TDI), etc., have been known as an aromatic polycarbodiimide. Such an aromatic polycarbodiimide has been used as flame and fire resistant films and heat resistant adhesives due to its excellent heat resistance.

A film of a conventionally known aromatic polycarbodiimide has a heat resistance in the point that even when the film is exposed to high temperature of higher than 400° C., the film does not form a volatile gas and decomposed monomers. However, when the film is subjected to a heat treatment at a temperature of higher than 200° C., the film loses the self-retention property and becomes brittle, thereby the film cannot endure the practical use. Further, the film has a low moisture resistance at high temperature and high pressure.

A conventional polymer induced from a known aromatic diisocyanate has the disadvantages that since the polymer has a high melting point, a melt-molding thereof is difficult, and film forming from the polymer solution is difficult because they have low solubility to organic solvents. Further, it may be difficult to generally produce a polymer having a high degree of polymerization for the conventional aromatic diisocyanate. Also, to obtain the mechanical characteristics of the polymer suitable for films and moldings, a divalent aromatic residue in the polymer skeleton must be a p-substituted bond, but such a polymer skeleton has a rigidity and is poor in flexibility.

SUMMARY OF THE INVENTION

As a result of various investigations to overcome the disadvantages of conventional aromatic polycarbodiimides and to obtain an aromatic polymer capable of giving high-efficient films and moldings excellent in heat resistance as well as moldability and flexibility, a novel polymer of the present invention has been successfully obtained.

According to the present invention, there is provided an aromatic polycarbodiimide having a structural unit represented by the following formula (A)

(A)

wherein R represents a divalent organic group represented by the following formula (1), (2), or (3) and n represents an integer;

(1)

wherein X represents a fluorine atom or a hydrogen atom;

(2)

wherein substituting positions of the 2 phenoxy groups bonding to the central benzene ring are 1,3-bonds or 1,4-bonds; and (3)

wherein X represents a fluorine atom or a hydrogen atom.

As a related information where R in the above formula (A) is represented by the above formula (1), an aromatic diisocyanate represented by the following formula (4) is disclosed in Example 12 of U.S. Pat. No. 4,017,459;

(5)

However, there is no description in the above U.S. patent about the production of a polycarbodiimide by polymerizing the aromatic diisocyanate. Furthermore, about the formula (1) in the formula (A) described above, wherein X is a fluorine atom, neither polymers nor monomers are reported.

DETAILED DESCRIPTION OF THE INVENTION

Figure 1:
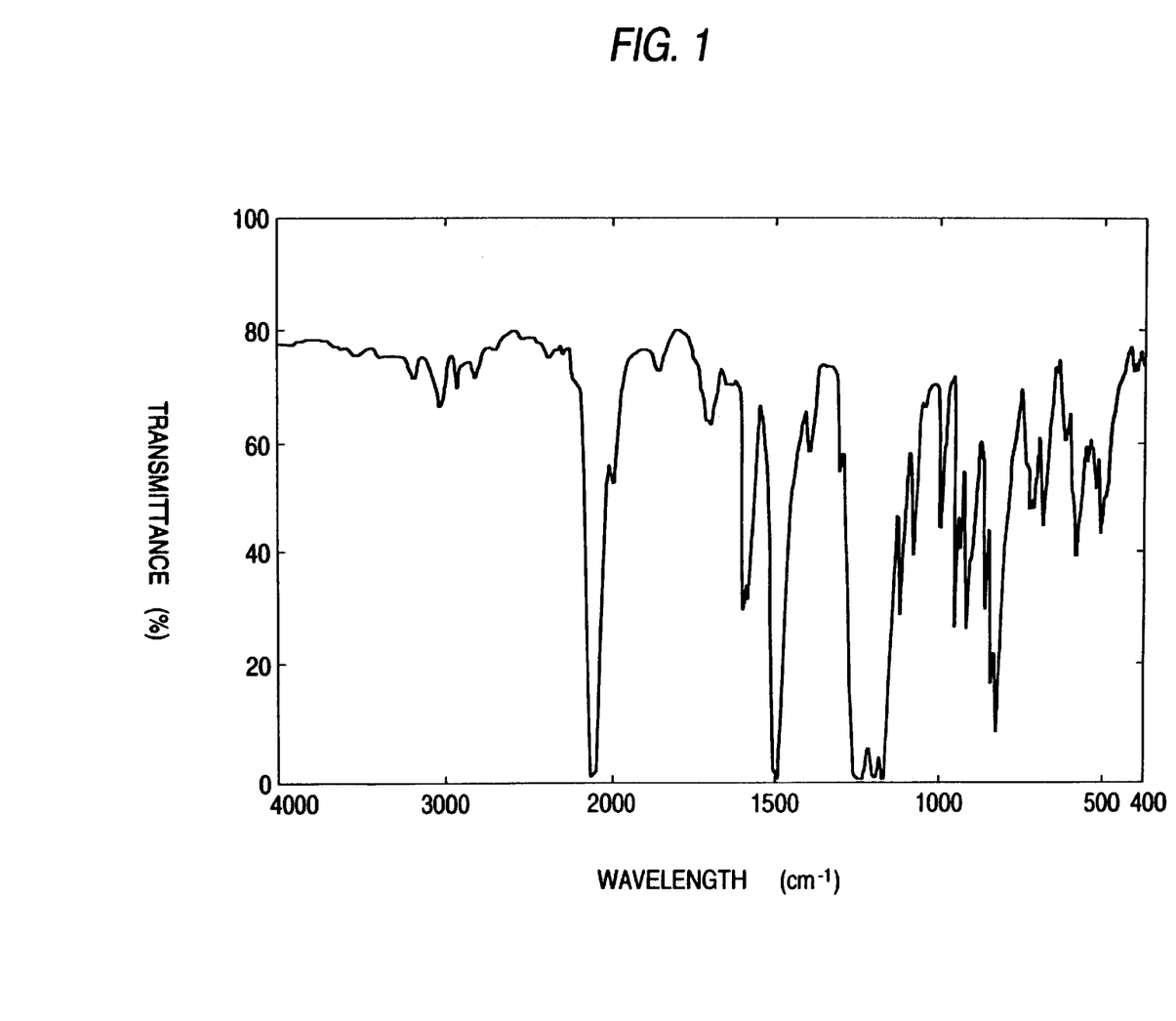
FIG. 1 is a graph showing the infrared absorption spectrum of the polymer obtained in Example 1.
Figure 2:
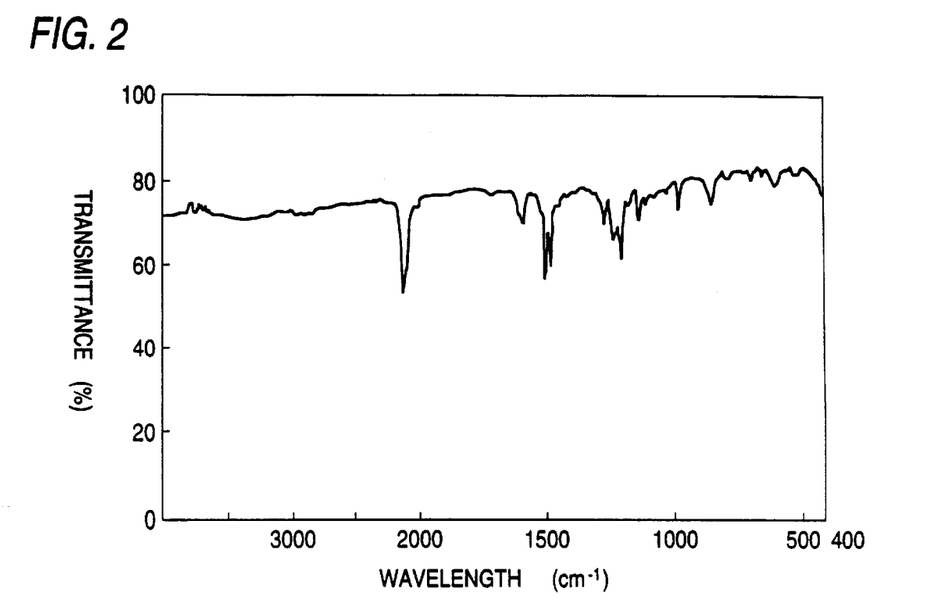
FIG. 2 is a graph showing the infrared absorption spectrum of the polymer obtained in Example 4.
Figure 3:
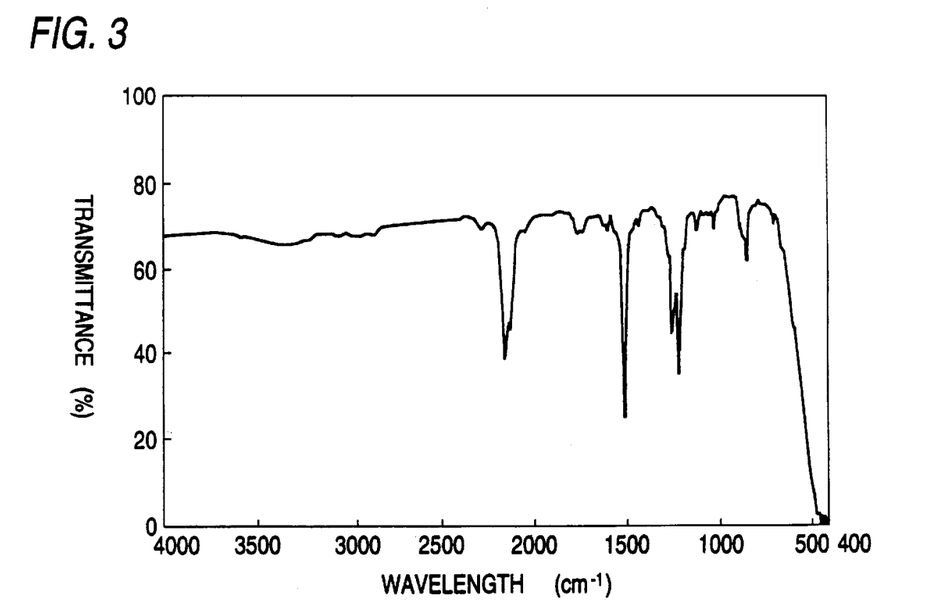
FIG. 3 is a graph showing the infrared absorption spectrum of the polymer obtained in Example 5.
Figure 4:
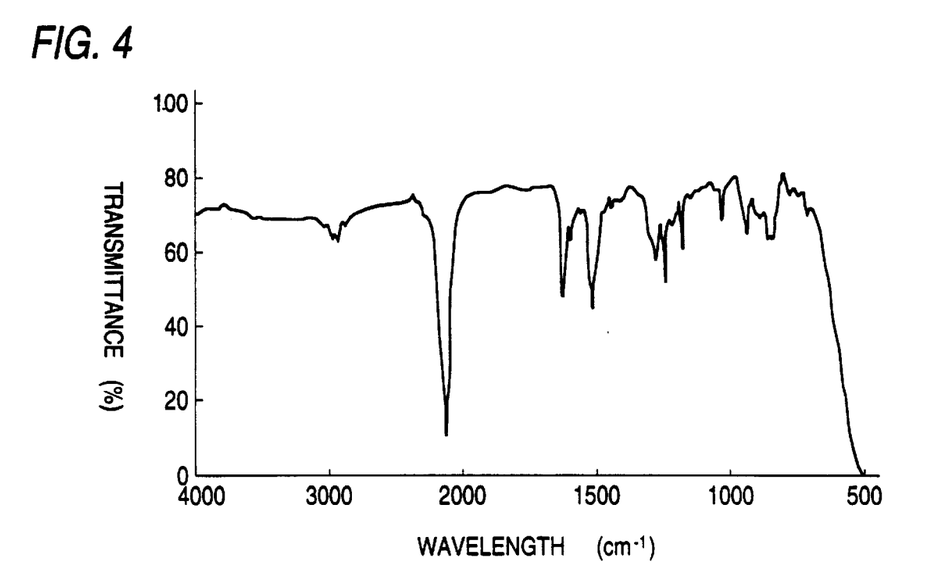
FIG. 4 is a graph showing the infrared absorption spectrum of the polymer obtained in Example 6.
Figure 5:
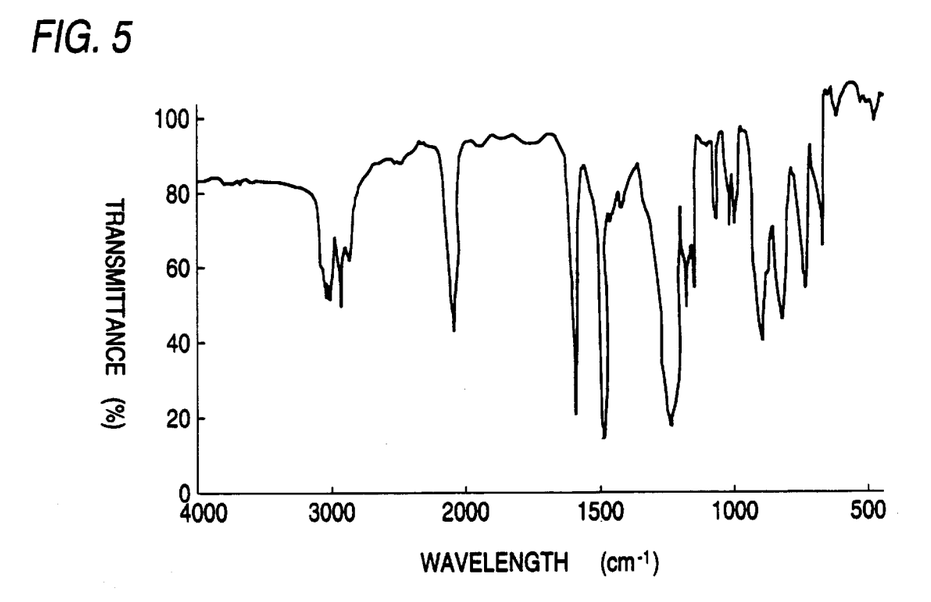
FIG. 5 is a graph showing the infrared absorption spectrum of the polymer obtained in Example 7.

The polymers of the present invention are represented by the formula (A) described above, wherein n is an integer, preferably an integer of from 2 to 200, and more preferably from 8 to 40. The films obtained from these polymers have very high heat resistance and moisture resistance. Also, after heat treatment, the films have a high flexibility. Furthermore, the aromatic polycarbodiimide of the present invention has an excellent dimensional stability as compared with conventional polycarbodiimides.

The polycarbodiimide of the present invention is obtained by polymerizing diisocyanates corresponding to the following formulae (5), (6), and (7), respectively, as the monomers alone or as mixtures thereof by the conventional method in the presence of a phosphorus catalyst.

(5)

wherein X represents a fluorine atom or a hydrogen atom.

(6)

wherein the substituting positions of the 2 phenoxy groups bonding to the central benzene ring are 1,3-bonds or 1,4-bonds.

(7)

wherein X represents a fluorine atom or a hydrogen atom.

The monomers which are used for the polymerization may be only the monomers described above, but the monomers may be copolymerized with other organic diisocyanate such as 4,4-diphenylmethane diisocyanate, 2,6-tolylene diisocyanate, 2,4-tolylene diisocyanate, 1-methoxypheny-2, 4-diisocyanate, 3,3'-dimethoxy-4,4'-diphenylmethane diisocyanate, 4,4'-diphenyl ether diisocyanate, 3,3'-dimethyl-4,4'-diphenyl ether diisocyanate, and o-tolylene diisocyanate within a range (for example, about 30 wt % or less) which does not lose the inherent properties of the monomers.

The reaction temperature at the polymerization is preferably from 40 to 100° C., and more preferably from 50 to 90° C. If the reaction temperature is lower than 40° C., the reaction time becomes too long, which is unsuitable for practical use, while if the reaction temperature is over 100° C., the selection of a suitable solvent becomes difficult.

The concentration of the isocyanate monomer in the synthesis of the polycarbodiimide is from 2 to 50% by weight (hereinafter referred to as simply "%") , preferably from 5 to 45%, and more preferably from 15 to 40%. If the concentration of the isocyanate monomer is lower than 2%, carbodiimidation may not proceed. If the concentration is over 50%, there is a possibility that the control of the reaction becomes difficult.

The organic solvent which is used in the synthesis of the polycarbodiimide and for the polycarbodiimide solution may be conventional solvents. Examples of the organic solvent are halogenated hydrocarbons such as tetrachloroethane, 1,2-dichloroethane, chloroform, etc.; ketone solvents such as acetone, methyl ethyl ketone, methyl isobutyl ketone, cyclohexanone, etc.; cyclic ether solvents such as tetrahydrofuran, dioxane, etc.; and aromatic hydrocarbon solvents such as toluene, xylene, etc. Those may be used alone or as mixtures of two or more thereof.

Examples of the catalyst which can be used for the carbodiimidation are phospholene oxides such as 1-phenyl-2-phospholene-1-oxide, 3-methyl-2-phospholene-1-oxide, 1ethyl-2-phospholene-1-oxide, 3-methyl-1-phenyl-2-phospholene-1-oxide, or 3-phospholene isomers thereof.

At the end, the middle, or the beginning of the polymerization reaction or over the whole polymerization reaction process, an end-capping treatment may be applied by adding a monoisocyanate. Examples of the monoisocyanate which can be used are phenyl isocyanate, p-nitrophenyl isocyanate, p- or m-tolyl isocyanate, p-formylphenyl isocyanate, etc. The polycarbodiimide solution thus obtained is excellent in the storage stability of the solution.

The molecular weight of the polycarbodiimide of the present invention is from 1,000 to 100,000, and preferably from 4,000 to 20,000 as a number average molecular weight. If the molecular weight is too high, the polycarbodiimide is easily gelled within from several minutes to several hours even when the polymer is allowed to stand at normal temperature, which is undesirable for practical use. Also, if the molecular weight thereof is too low, the film formed from the polymer is undesirably lacking in the reliability.

After completion of the reaction, the reaction solution is added to a poor solvent such as methanol, ethanol, hexane, etc., to deposit the polycarbodiimide as precipitates, and unreacted monomers and the catalyst may be removed. By conducting such an operation, the solution stability of the polycarbodiimide can be improved. After depositing the polycarbodiimide as the precipitates, the precipitates are washed by a definite procedure, and dried. By dissolving again the polycarbodiimide in an organic solvent, a polycarbodiimide solution can be obtained. (Production of Film)

The polycarbodiimide resin obtained by the polymerization reaction can be formed into a film having an appropriate thickness by the conventional method. The coating temperature for forming the film from the polycarbodiimide solution is from 20 to 150° C., preferably from 50 to 120° C., and more preferably from 70 to 100° C. If the coating temperature is lower than 20° C., the solvent sometimes remains in the film. Also, if the coating temperature is over 150° C., heat curing of the film sometimes proceeds. If required and necessary, post-curing may be carried out.

The stretched film of the polycarbodiimide is produced, for example, as follows using the polycarbodiimide resin prepared by the production method described above.

The polycarbodiimide resin solution is formed into a film form by a conventional method such as casting, spin coating, and roll coating. The film coated may be usually dried at a temperature necessary for removing the solvent. For example, the film can be dried at a temperature of from 50 to 200° C. In particular, for drying the coated film without excessively proceeding the curing reaction of the polycarbodiimide resin, it is desirable to dry the film at a temperature of from 60 to 150° C. If the drying temperature is too low, the solvent undesirably remains in the film. Also, if the drying temperature is too high, crosslinking of the polycarbodiimide proceeds, whereby the inconveniences such as breaking and poor stretching of the film are undesirably liable to occur at the stretching process of the film. The form of the stretched film of the polycarbodiimide may be a tube form, a sleeve form, or other various forms.

The film of the polycarbodiimide, for example, the film thereof formed by the casting method is stretched in one direction (the principal axis direction) at from 1.2 to 10 times, and preferably from 2 to 6 times, under a definite condition. Furthermore, if desired, the film can be further stretched in the direction rectangular to the above-described stretched direction (principal axis direction) in the range of from 1 to 5 times, and preferably from 1.1 to 1.6 times. In the order of stretching, the film may be first stretched to either direction.

By stretching the film to the principal axis direction and the direction rectangular to the principal axis direction, the shock resistance of the stretched film obtained is improved and the property of being liable to be teared in one direction is relaxed. If the stretching times to the direction rectangular to the above-described stretched direction (principal axis direction) are over 5 times, the heat shrinkage to the direction rectangular to the principal axis direction becomes too large, so that in covering an article with the film by a heat shrinking treatment, the finished cover film is undulated and becomes ununiform.

The stretching temperature is preferably from 40 to 200° C. such that drying of the film is performed without proceeding too much the curing reaction of the polycarbodiimide resin. If the stretching temperature is lower than 40° C., a sufficient stretching ratio is not obtained and the film is liable to break. Also, if the stretching temperature is over 200° C,, the curing reaction of the polycarbodiimide resin partially proceeds, whereby there is a tendency to decrease the heat recovering property.

There is no particular restriction on the stretching method of the film and the conventional method such as a roll stretching method, a long gap stretching method, a tenter stretching method, and a tubular stretching method may be employed.

The film of the polycarbodiimide thus formed can be used as heat-resistant insulating materials for electronic and electric parts and as adhesive films. Also, the film subjected to the stretching treatment is used as, for example, heat-resistant covering materials for various articles.

For covering an article using the stretched film, for example, after covering an article to be protected with the heat shrinkable film mainly comprising the polycarbodiimide resin, the covered article is subjected to a heat treatment to cure the film. By the heat treatment, the curing reaction of the polycarbodiimide proceeds, the polycarbodiimide resin flows into the uneven portion of the surface of the article to be covered to given an anchoring effect, and simultaneously an action such as a chemical reaction of polar groups on the surface of the article to be covered and cumulative multiple bonds of the polycarbodiimide resin occurs. As a result, the polycarbodiimide resin is chemically and physically adhered to the article.

There is no particular restriction on the article to be covered. Examples thereof are sheets, tabular materials, and tubular materials, which are made of glasses, metals, resins, and ceramics. Representative articles are electric wires such as cables for electric power, glass-made bottles, and electronic parts.

The diisocyanate monomer which is the raw material for the aromatic polycarbodiimide of the present invention is explained below.

In the monomers represented by the formula (5) described above, 2,2-bis[4-(4-isocyanatophenoxy)phenyl]propane is obtained by the conventional production method such as a method of reacting 2,2-bis[4-(4-aminophenoxy)phenyl] propane with phosgene in chlorobenzene and extracting the reaction mixture obtained with pertroleum ether as described in, for example, U.S. Pat. No. 4,017,459.

2,2-Bis [4-(4-diisocyanatophenoxy)phenyl] hexafluoropropane is a novel aromatic diisocyanate and can be synthesized by isocyanating a precursor of a diisocyanate compound by the conventional method. Examples of the precursor are diamine compounds such as 2,2-bis[4-(4-aminophenoxy)phenyl]hexafluoropropane (BAPF) and alkyl- or halogen-substituted products thereof (e.g., HFBAPP, trade name, made by Wakayama Seika Kogyo K. K. and BIS-AF-A, trade name, made by Central Glass Co., Ltd.).

1,3- or 1,4-Bis(4-isocyanatophenoxy)benzene, which is the monomer represented by the formula (6) described above, is also a novel aromatic diisocyanate and can be synthesized by isocyanating a precursor of a diisocyanate compound by the conventional method. Examples of the precursor which can be used are 1,3- or 1,4-bis(4-aminophenoxy)benzene. Commercially available products of such a diamine compound are, for example, TPE-R and TPE-Q (trade name, made by Wakayama Seika Kogyo K. K.).

2,2'-Dimethyl-4,4'-diisocyanatobiphenyl and 2,2'-bis(trifluoromethyl)-4,4'-diisocyanatobiphenyl, which are the monomer represented by the formula (7) described above, are a novel aromatic diisocyanate and can be synthesized by isocyanating a precursor of a diisocyanate compound by the conventional method. Examples of the precursor are diamine compounds such as 2,2-dimethyl-4,4'-diaminobiphenyl or 2,2'-bid(trifluoromethyl)-4,4'-diaminobiphenyl.

The method of isocyanating such a diamine compound includes a method of reacting the diamine compound with phosgene, diphenyl carbonate or carbonyl diimidazole. Also, an urethane intermediate is formed from the diamine compound using a halogenated alkyl formate and the isocyanate may be formed from the intermediate in the presence of a catalyst such as a chlorosilane or catecholborane. Another method in a method of using a dicarboxylic acid such as 2,2-bis[4-(4-carboxyphenoxy)phenyl]hexafluoropropane, as a precursor of the diisocyanate and isocyanating the dicarboxylic acid by a Curtius decomposition.

In these production methods, the method of forming a urethane intermediate from the diamine compound using a halogenated alkyl formate and isocyanating the intermediate using a chlorosilane as the catalyst, described in G. Greber, et al., *Angew. Chem.,* Int. Ed., Vol. 17, No. 12, 941(1968) and the method of using catecholborane as the catalyst, described in V. L. K. Valli, et al., *J. Org. Chem.,* Vol. 60, 257(1995) are preferred in the points of the yield and the safety. These methods are explained below.

(Synthesis of Urethane Intermediate)

An urethane intermediate is synthesized by reacting the corresponding diamine compound with a halogenated alkyl formate such as methyl chloroformate, ethyl chloroformate, phenyl chloroformate, or p-nitrophenyl chloroformate. In these halogenated alkyl formates, phenyl chloroformate or p-nitrophenyl chloroformate is preferred for smoothly proceeding the formation of the isocyanate. However, since p-nitrophenyl chloroformate has a high activity and has a possibility of causing a side reaction, phenyl chloroformate is most preferred.

Any solvents capable of dissolving the diamine may be used as the solvent for use in these reaction. Examples of the solvent are ether compounds such as tetrahydrofuran (THF), dioxane, diethyl ether, etc.; aromatic hydrocarbon compounds such as toluene, xylene, benzene, etc.; ketone compounds such as acetone, methyl ethyl ketone, etc.; and ester compounds such as ethyl acetate, etc. These solvents may be used alone or as a mixture of 2 or more thereof.

The reaction temperature is from −40 to 70° C., preferably from −20 to 50° C., and more preferably from 0 to 30° C. If the reaction temperature is lower then −40° C., the reaction is difficult to proceed, while if the reaction temperature is over 70° C., there is a possibility of causing a side reaction such as a condensation, etc.

A base for trapping hydrogen chloride formed by the reaction may be any base so long as it is dissolved in a solvent used and does not hinder the reaction. Examples of the base are triethylamine, pyridine, and sodium hydroxide. The amount of the base used is preferably from 2.0 to 3.4 times the mol number of the diamine used.

The conventional known method such as a recrystallization, a column chromatography, etc., can be used as the purification method of the urethane intermediate obtained. If necessary, distillation may be carried out.

(a) Isocyanation Using Chlorosilane

For isocyanating the urethane intermediate using a chlorosilane, the urethane intermediate is thermally decomposed using a chlorosilane as a catalyst in an amount of from 2.0 to 4.6 times the molar amount of urethane. Examples of such achlorosilane are tremethylchlorosilane, triethylchlorosilane, trimethoxychlorosilane, and tetrachlorosilane. Trimethylchlorosilane is preferred from the points of ease of handling and the cost.

The solvent used may be any solvents so long as it can dissolve or suspend urethane. Examples of the solvent are halogenated hydrocarbon compounds such as dichloromethane, chloroform, dichloroethane, tetrachloroethane, etc., besides the ether compounds, the aromatic hydrocarbon compounds, the ketone compounds, and the ester compounds as described above.

These solvents may be used alone or as a mixture of 2 or more kinds of them. If required and necessary, the reaction temperature may be changed by replacing a part or the whole of the solvent which has lower boiling point with other solvent which has higher boiling point.

The reaction temperature is from 0° C. to the boiling point of the solvent used, and preferably from room temperature from the boiling point. If the reaction temperature is too low, the reaction may not proceed. On the other hand, if the reaction temperature is too high or the system is superheated for a long time, the reaction product may decomposed. Thus, it is preferred that while tracing the reaction by IR, or the like, the temperature is gradually raised to proceed the reaction.

For trapping hydrogen chloride formed at the reaction, a base such as triethylamine may be similarly used.

(b) Isocyanation Using Halogenated Catecholborane

For isocyanating the urethane intermediate, a method of using a halogenated catecholborane as the catalyst in place of the above-described chlorosilane may be employed. Examples of the halogenated catecholborane are chlorocatecholborane, bromocatecholborane, etc. Chlorocatecholborane is preferred from the points of the cost and the handling property. Since catecholboranes have an activity higher than cholrosilanes to the thermal decomposition, urethanes other than phenylurethane can be used as the urethane used.

The solvent which is used for the reaction may be the same solvents used in forming the isocyanate using the chlorosilane as described above.

When phenylurethane is used, the reaction temperature is generally from −50° C. to 80° C., preferably from 20 to 60° C., and more preferably from 0 to 40° C., and it is better to change the reaction temperature according to the kind of the urethane used. If the reaction temperature is outside the above range or the system is superheated, the reaction may not proceed or the reaction product may decompose. Therefore, it is better that while tracing the reaction by IR, or the like, the temperature is gradually raised to proceed the reaction.

The base for trapping hydrogen chloride formed at the reaction may be the same bases as described above.

After completion of the reaction, the isocyanates monomer thus obtained can be purified by removing the solvent therefrom and applying a flash column, a recrystallization, or a vacuum distillation.

The polycarbodiimide of the present invention has excellent heat resistance and moisture resistance, and the film thereof shows an excellent dimensional stability and is useful as heat-resistant covering materials in, for example, a soldering process at the production of electronic parts. Also, the film of the polycarbodiimide subjected to a stretching treatment has a heat recovery property and can be used as a heat shrinking film. Further, the polycarbodiimide has excellent solubility in solvents.

The present invention is described in more detail by reference to the following examples, but it should be understood that the invention is not construed as being limited thereto.

Heat curing temperature of a polycarbodiimide obtained was measured using DSC-200 (trade mane, manufactured by SHIMADZU CORPORATION), and the exothermic peak at the formation of a trimer was defined as the heat curing temperature.

Production Example 1

Production of 2,2-bis[4-(4-isocyantophenoxy)phenyl]-hexafluoropropane

In a one-liter 3-necked flask equipped with a dropping funnel were placed 20 g (0.039 mol) of 2,2-bis[4-(4-aminophenoxy)phenyl]hexafluoropropane (BAPF), 200 ml of THF, and 9.6 g (0.095 mol) of triethylamine. 14.5 g (0.093 mol) of phenyl chloroformate was placed in the dropping funnel and the reaction vessel was cooled to 0° C. with an ice bath. Phenyl chloroformate was added dropwise to the mixture over a period of 15 minutes, and while returning the temperature to room temperature, the mixture was stirred for 30 minutes. The salt formed was hydrolyzed with 100 ml of water and extracted with chloroform. The organic layer formed was collected and dried using anhydrous magnesium sulfate. The solvent was distilled off from the reaction mixture and the residue was recrystallized with toluene to obtain 22.2 g (yield 75%) of an urethane intermediate as white solids.

20 g (0.026 mol) of the urethane intermediate obtained as the white solids was placed in a one-liter 3-necked flask equipped with a dropping funnel together with 170 ml of methylene chloride and 8.0 g (0.079 mol) of triethylamine. 5.7 g (0.052 mol) of trimethy chlorosilane was placed in the dropping funnel, trimethylchlorosilane was added dropwise to the mixture at room temperature over a period of 5 minutes, the solvent was replaced with toluene, and while gradually raising the temperature to 120° C., the resulting mixture was stirred for 4 hours. The mixture was then further stirred at 120° C. for 2 hours. Salts formed were removed by filtration and the solution formed was concentrated by an evaporator. The reaction mixture was purified by a flash column to obtain 7.3 g (yield 49%) of white solids.

The melting point of the compound obtained was 137° C. Molecular ion peak of $M^+=570$ was observed by mass spectrum, and absorption of the carbonyl group of isocyanate was observed at 2260 $cm^{-1}$ by the IR spectrum. For measuring the mass spectrum, Hitachi M80A (trade name, manufactured by Hitachi, Ltd.) was used, and for the measurement of the IR spectrum, IR-810 (trade name, manufactured by Nippon Bunko Kogyo K. K.) was used.

It was confirmed that the compound obtained was 2,2-bis[4-(4-isocyanatophenoxy)phenyl]hexafluoropropane (BAPF-NCO).

Production Example 2

Production of 1,3-bis(4-isocyanatophenoxy)benzene

In a 500 ml 3-necked flask equipped with a dropping funnel were placed 10 g (0.034 mol) of 1,3-bis(4-aminophenoxy)benzene, 100 ml of THF, and 7.6 g (0.075 mol) of triethylamine. 11.7 g (0.075 mol) of phenyl chloroformate was placed in the dropping funnel, and the reaction vessel was cooled to 0° C. with an ice-bath. Phenyl chloroformate was added dropwise to the mixture over a period of 15 minutes, and while returning the temperature to room temperature, the resulting mixture was stirred for 2 hours. The salt formed was hydrolyzed with 100 ml of water and extracted with chloroform. The organic layer thus formed was collected and dried using anhydrous magnesium sulfate. The solvent was distilled off and the residue was recrystallized with toluene to obtain 11.7 g (yield 65%) of an urethane intermediate as white solids.

1.1 g (2.1 mmol) of the urethane intermediate obtained as white solids was placed in a 3-necked flask (50 ml) equipped with a dropping funnel together with 10 ml of methylene chloride and 0.58 g (5.7 mmol) of triethylamine. 0.69 g (6.3 mmol) of trimethylchlorosilane was placed in the dropping funnel, and was added dropwise to the mixture at room temperature over a period of 5 minutes, the solvent was replaced with toluene, and while gradually raising the temperature to 120° C., the resulting mixture was stirred for 4 hours. The mixture was then further stirred at 120° C. for 1 hour. Salts formed was removed by filtration and the solution formed was concentrated by an evaporator. By purifying the reaction mixture by a flash column, 0.5 g (yield 69%) of white solids were obtained.

The melting point of the compound obtained was 188° C. Molecular ion peak of $M^+=344$ was observed by the mass spectrum, and absorption of the carbonyl group of isocyanate was observed at 2270 $cm^{-2}$ by the IR spectrum. The measurement apparatus for the mass spectrum and the IR spectrum were the same as those in Production Example 1.

It was confirmed that the compound obtained was 1,3-bis(4-isocyanatophenoxy)benzene.

Production Example 3

Production of 2,2'-bis(trifluoromethyl)-4,4'-diisocyanatobipheyl

In a 500 ml 3-necked flask equipped with a condenser and a dropping funnel were placed 20 g (0.062 mol) of 2,2'-bis(trifluoromethyl)-4,4'-diaminobiphenyl (BTFB), 200 ml of ethyl acetate, and 13.9 g (0.14 mol) of triethylamine. 20.7 g (0.13 mol) of phenyl chloroformate was placed in the dropping funnel, and the reaction vessel was cooled to 0° C. by an ice-bath. Phenyl chloroformate was added dropwise to the mixture over a period of 20 minutes, and while returning the temperature to room temperature, the resulting mixture was stirred for 1 hour. The salt formed was hydrolyzed with 100 ml of water and extracted with chloroform. The organic layer formed was collected and dried using anhydrous magnesium sulfate. When the solvent was distilled off, light-brown solids were almost quantitatively obtained.

In a 2-necked flask (50 ml) equipped with a condenser and a dropping funnel were placed 1.0 g (1.8 mmol) of the urethane intermediate obtained above, 10 ml of methylene chloride, and 0.73 g (7.2 mmol) of triethylamine. 1.2 g (11.0 mmol) of trimethylchlorosilane was added dropwise to the mixture from the dropping funnel at room temperature, and the resulting mixture was stirred for 15 minutes. The solvent was replaced with toluene, and while gradually raising the temperature to 100° C., the mixture was stirred for 2 hours. Salts formed were removed by filtration and the solution formed was concentrated by an evaporator. The reaction mixture was purified by a flash column to obtain 0.08 g (yield 12%) of white solids.

About the compound obtained, the molecular ion peak of $M^+=372$ was observed by the mass spectrum and the absorption of the carbonyl group of isocyanate was observed at 2250 $cm^{-1}$ by the IR spectrum. The measurement appratuses of the mass spectrum and the IR spectrum were the same as those used in Production Example 1.

It was confirmed that the compound obtained was 2,2'-bis(trifluoromethyl)-4,4'-diisocyanatobiphenyl.

Production Example 4

Production of 2,2'-dimethyl-4,4'-diisocyanatobiphenyl

In a 3-necked flask (200 ml) were placed 84.0 g (0.018 mol) of the urethane intermediate of 2,2'-dimethyl-4,4'-diaminobiphenyl produced as in Production Example 3,80 ml of methylene chloride, and 5.3 g (0.052 mol) of triethylamine. 6.4 g (0.059 mol) of trimethylchlorosilane was added dropwise to the mixture from the dropping funnel of the flask at room temperature over a period of 5 minutes. The solvent was replaced with toluene, and while gradually raising the temperature to 120° C., the resulting mixture was stirred for 6 hours. Salts formed were removed by filtration, and the solution formed as concentrated and purified by flash column using methylene chloride as the developing solvent to obtain 3.4 g (yield 72%) of white oily product.

About the compound obtained, the molecular ion peak of $M^+=264$ was observed by the mass spectrum and the absorption of the carbonyl group of isocyanate was observed at 2250 $cm^{-1}$ by the IR spectrum. The measurement apparatuses of the mass spectrum and the IR spectrum were the same as those used in Production Example 1.

It was confirmed that the compound obtained was 2,2'-dimethyl-4,4'-diisocyanatobiphenyl.

EXAMPLE 1

In a 100 ml egg-plant type flask were placed 5.0 g (8.7 mmol) of 2,2-bis[4-(4-isocyanatophenoxy)phenyl]-hexafluoropropane, 25 ml of THF, and 0.0135 g (0.070 mmol) of a carbodiimidation catalyst (3-methyl-1-phenyl-2-phospholene-1-oxide). When the mixture was stirred at 60° C. for 6.5 hours, a solution of a polycarbodiimide having a molecular weight Mn of 8,300 was obtained. The varnish obtained was coated on a glass plate by casting and dried at 90° C. for 30 minutes to obtain a film having a thickness of 40 µm. The heat-curing temperature of the film was higher than 400° C., and when a heat treatment was applied to the film at 250° C. for 1 hour, the film had flexibility.

The film obtained by casting as described above was heated to 100° C. and monoaxially stretched twice. The heat recovery force of the stretched film measured was 80 kg/cm$^2$. When the heat recovered film was subjected to a heat treatment at 250° C. for 1 hour, the film had sufficient flexibility.

EXAMPLE 2

In a 30 ml egg-plant type flask were placed 1.1 g (2.4 mmol) of 2,2-bis[4-(4-isocyanatophenoxy)phenyl]propane, 5.5 ml of THF, and 0.0035 g (0.018 mmol) of a carbodiimidation catalyst (3-methyl-1-phenyl-2-phospholene1-oxide). When the mixture was stirred at 60° C. for 10 hours, a solution of a polycarbodiimide having a molecular weight Mn of 5,000 was obtained. The varnish obtained was coated on a glass plate by casting and dried at 90° C. for 30 minutes to obtain a film having a thickness of 10 µm. The heat-curing temperature of the film was higher than 370° C., and when the film was subjected to heat treatment at 250° C. for 1 hour, the film had flexibility.

2,2-Bis[4-(4-isocyanatophenoxy)phenyl]propane, which was the raw material, was produced as follows.

2,2-Bis[4-(4-aminophenoxy)phenyl]propane dissolved in chlorobenzene was added dropwise to a chlorobenzene solution of phosgene at 10° C. After refluxing the mixture to proceed the reaction, the reaction mixture was cooled to deposit crystals. The crystals were collected and dried to obtain 2,2-bis[4-(4-isocyanatophenoxy)phenyl]propane having a melting point of from 68 to 69° C.

EXAMPLE 3

In a 100 ml of egg-plant type flask were placed 3.04 g (5.3 mmol) of 2.2-bis[4-(4-isocyanatophenoxy)phenyl]-hexafluoropropane, 30 ml of THF, and 0.033 g (0.17 mmol) of a carbodiimidation catalyst (3-methyl-1-phenyl-2-phospholene-1-oxide). After stirring the mixture at 60° C. for 2 hours, 0.41 g (3.1 mmol) of m-tolyl isocyanate was added followed by stirring for further 2 hours to obtain a solution of a polycarbodiimide having a molecular weight Mn of 8,000. The varnish obtained was reprecipitated with 300 ml of hexane and dried under a reduced pressure to obtain a white powdery polycarbodiimide. The polycarbodiimide could be redissolved in THF, cyclohexane, toluene, acetone, chloroform, etc. A 15% solution of the polycarbodiimide could be stored in a refrigerator for 1 month.

EXAMPLE 4

In a 100 ml of egg-plant type flask were placed 0.6 g (1.7 mmol) of 1,3-bis(4-isocyanatophenoxy)benzene, 4 ml of THF, and 0.0068 g (0.035 mmol) of a carbodiimidation catalyst (3-methyl-1-phenyl-2-phospholene-1-oxide). When the mixture was stirred at 60° C. for 3.5 hours, a solution of a polycarbodiimide having a molecular weight Mn of 9,500 was obtained. The varnish obtained was coated on a glass plate by casting and dried at 90° C. for 30 minutes to obtain a film having a thickness of 22 µm. The heat-curing temperature of the film was 360° C., and when the film was subjected to a heat treatment at 200° C. for 1 hour, the film had flexibility.

The film obtained by casting as above was heated at 80° C. and monoaxially stretched. The heat recovery force of the stretched film measured was 77 kg/cm$^{-2}$ and the ratio of heat recovery (R) defined below was 100%.

$R(\%)=\{$(length before stretching)−(length after heat shrinking)/ (length after stretching)−(length before stretching)$\}\times 100$

EXAMPLE 5

1,4-Bis(4-isocyanatophenoxy)benzene was obtained using the same method as in Production Example 2. The same polymerization as in Example 4 was conducted except that the diisocyanate thus obtained was used, to obtain a solution of a polycarbodiimide having a molecular weight Mn of 9,500.

The varnish thus obtained was coated on a glass plate by casting and dried at 90° C. for 30 minutes to obtain a film having a thickness of 20 µm. The heat-curing temperature of the film was 370° C., and when the film was subjected to a heat treatment at 250° C for 1 hour, the film had flexibility.

EXAMPLE 6

In a 100 ml egg-plant type flask were placed 3.4 g (0.013 mol) of 2,2'-dimethyl-4,4'-diisocyanatobiphenyl (mTB-NCO) obtained in Production Example 4, 20 ml of THF, and 0.020 g (0.20 mmol) of a carbodiimidation catalyst (3-methyl-1-phenyl-2-phospholene-1-oxide). When the mixture was stirred at 60° C. for 3.5 hours, a solution of a polycarbodiimide having a molecular weight Mn of 3,000 was obtained. The varnish thus obtained was coated on a glass plate by casting and dried at 90° C. for 30 minutes to obtain a film having a thickness of 16 µm. The heat-curing temperature of the film was 400° C. When the film was subjected to a heat treatment at 200° C. for 1 hour, the film had flexibility and the linear expansion coefficient thereof was $4.6 \times 10^{-5} K^{-1}$.

The film obtained by casting as above was heated to 80° C. and monoaxially stretched twice. The heat recovery force measured was 55 kg/cm$^{-2}$ and the ratio of heat recovery was 100%.

EXAMPLE 7

The same polymerization as in Example 6 was conducted except that 2,2'-bis(trifluoromethyl)-4,4'-diisocyanatobiphenyl obtained in Production Example 3 was used, to obtain a solution of a polycarbodiimide having a molecular weight Mn of 4,000. The varnish thus obtained was coated on a glass plate by casting and dried at 90° C. for 30 minutes to obtain a film having a thickness of 18 µm. The heat-curing temperature of the film was 330° C. When the film was subjected to a heat treatment at 200° C. for 1 hour, the film had flexibility and the linear expansion coefficient was $5.2 \times 10^{-5} K^{-1}$.

EXAMPLE 8

In a 100 ml egg-plant type flask were placed 2.0 g (3.5 mmol) of 2,2-bis[4-(4-isocyanatophenoxy)phenyl]-hexafluoropropane obtained in Production Example 1, 0.92 λ (3.5 mmol) of 2,2'-dimethyl-4,4'-diisocyanatobiphenyl obtained in Production Example 4, 30 ml of THF, and 9.4 mg (0.049 mmol) of a carbodiimidation catalyst (3-methyl-1-phenyl-2-phospholene-1-oxide). When the mixture was stirred at 60° C. for 9 hours, a solution of a polycarbodiimide having a molecular weight Mn of 10,000 was obtained. The varnish thus obtained was coated on a glass plate by casting and dried at 90° C. for 30 minutes to obtain a film having a thickness of 20 µm. The heat-curing temperature of the film was higher than 400° C., and when the film was subjected to a heat treatment at 250° C. for 1 hour, the film had flexibility.

The film obtained above was heated to 100° C. and monoaxially stretched 1.5 times. The heat recovery force of the film was 60 kg/cm². When the heat recovered film was subjected to a heat treatment at 250° C. for 1 hour, the film had sufficient flexibility.

Comparative Example 1

The same polymerization as in Example 1 was conducted using MDI as the monomer, to obtain a solution of a polycarbodiimide having a molecular weight Mn of 10,000 using THF as a solvent. The varnish thus obtained was coated on a glass plate by casting and dried at 90° C. for 30 minutes to obtain a film having a thickness of 50 μm. The heat-curing temperature of the film was 350° C. When the film was subjected to a heat treatment at 200° C. for 1 hour, the film was discolored and lost flexibility and self-retention property. When the film was heat treated at 150° C., the linear expansion coefficient was $7.5 \times 10^{-5} K^{-1}$.

The film obtained by casting as above was heated to 90° C. and monoaxially stretched twice. The heat recovery force of the stretched film measured was 100 kg/cm². When the heat recovered film was heat treated at 250° C. for 1 hour, the flexibility of the film was greatly decreased.

Comparative Example 2

In a 100 ml egg-plant type flask were placed 4 g (0.016 mol) of MDI, 20 ml of THF, and 0.015 g (0.078 mmol) of a carbodiimidation catalyst (3-methyl-1-phenyl-2-phospholene-1-oxide). After stirring the mixture at 60° C. for 5 hours, 0.28 g (2.1 mmol) of m-tolylene isocyanate was added to the mixture, and the resulting mixture was further stirred for 2 hours to obtain a solution of a polycarbodiimide having a molecular weight Mn of 8,000. The varnish was reprecipitated with 300 ml of hexane and dried under reduced pressure to obtain a white powdery polycarbodiimide. The product was not, however, dissolved in organic solvents such as THF, cyclohexane, toluene, acetone, etc.

This shows that the polymer skeleton of the polycarbodiimide produced form MDI has a rigidity and is poor in solubility.

While the invention has been described in detail and with reference to specific embodiments thereof, it will be apparent to one skilled in the art that various changes and modifications an be made therein without departing from the spirit and scope thereof.

What is claimed is:

1. An aromatic polycarbodiimide having a structural unit represented by the following formula (A)

(A)

wherein R represents a divalent organic group represented by any one of following formula (1) (2), and (3) and n represents an integer;

(1)

wherein X represents a fluorine atom or a hydrogen atom, (2)

wherein substituting positions of the 2 phenoxy groups bonding to the central benzene ring are 1,3-bonds or 1,4-bonds, (3)

wherein X represents a fluorine atom or a hydrogen atom.

2. The aromatic polycarbodiimide of claim 1, wherein n in the formula (A) is an integer of from 2 to 200.

3. A polycarbodiimide solution formed by dissolving the aromatic polycarbodiimide of claim 1 in an organic solvent.

4. A polycarbodiimide film formed by forming the aromatic polycarbodiimide of claim 1 into a film.

5. The polycarbodiimide film of claim 4, wherein said film is stretched in at least a monoaxial direction.

* * * * *

UNITED STATES PATENT AND TRADEMARK OFFICE
CERTIFICATE OF CORRECTION

PATENT NO.   : 6,313,258 B1
DATED        : November 6, 2001
INVENTOR(S)  : Sakamoto, Michie, Mochizuki, Amane, Michiharu, and Yamamoto It is certified that error appears in the above-identified patent and that said Letters Patent is hereby corrected as shown below:

<u>Title page,</u>
Item [63], delete "now Pat. No. 5,350,817".

Signed and Sealed this

Second Day of April, 2002

Attest:

JAMES E. ROGAN
Attesting Officer   Director of the United States Patent and Trademark Office